(12) United States Patent
Ukaji (10) Patent No.: US 7,081,950 B2
(45) Date of Patent: Jul. 25, 2006

(54) STAGE DEVICE AND CONTROL METHOD THEREFOR, EXPOSURE APPARATUS, AND DEVICE MANUFACTURING METHOD

(75) Inventor: Takao Ukaji, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 10/849,156

(22) Filed: May 20, 2004

(65) Prior Publication Data

US 2004/0239910 A1   Dec. 2, 2004

(30) Foreign Application Priority Data

May 27, 2003   (JP) .............................. 2003-149568

(51) Int. Cl.
- G03B 27/58   (2006.01)
- G03B 27/62   (2006.01)
- G03B 27/32   (2006.01)
- H02K 41/00   (2006.01)

(52) U.S. Cl. .......................... 355/72; 355/75; 355/77; 310/12

(58) Field of Classification Search ................ 355/72, 355/75; 310/12
See application file for complete search history.

(56) References Cited

U.S. PATENT DOCUMENTS

| 5,767,948 A | * | 6/1998 | Loopstra et al. ............... 355/53 |
| 5,773,953 A | | 6/1998 | Ukaji et al. ................. 318/687 |
| 5,844,664 A | * | 12/1998 | Van Kimmenade et al. .. 355/53 |
| 5,844,666 A | * | 12/1998 | Van Engelen et al. ......... 355/72 |
| 5,953,105 A | * | 9/1999 | Van Engelen et al. ........ 355/53 |
| 6,285,457 B1 | | 9/2001 | Ukaji ......................... 356/500 |
| 6,359,679 B1 | | 3/2002 | Ito et al. ....................... 355/75 |
| 6,717,653 B1 | | 4/2004 | Iwamoto et al. ............... 355/72 |
| 2002/0018195 A1 | | 2/2002 | Iwamoto et al. ............... 355/72 |

FOREIGN PATENT DOCUMENTS

| JP | 2000-206279 | 7/2000 |
| JP | 2002-8971 | 1/2002 |

\* cited by examiner

*Primary Examiner*—W. B. Perkey
*Assistant Examiner*—Vivian Nelson
(74) *Attorney, Agent, or Firm*—Fitzpatrick, Cella, Harper & Scinto (57) ABSTRACT

A stage device including a base plate which includes a reference surface, a stage which can move along the reference surface, a mass body which can move with respect to the base plate or a structure of the base plate, and a control unit which drives and controls the mass body so as to cancel a reaction force in a translational direction generated during a movement of the stage and an offset load about a horizontal axis, and to reduce a rotational reaction force about a vertical axis. The control unit includes a mass body model control unit which generates a virtual control target value of the mass body to cancel the rotational reaction force about the horizontal axis generated during the movement of the stage, on the basis of target position information of the stage, and a mass body model based on the virtual control target value. The control unit drives and controls the mass body by using virtual positional information of the mass body model as an actual mass body control target value.

12 Claims, 7 Drawing Sheets

STAGE DEVICE AND CONTROL METHOD THEREFOR, EXPOSURE APPARATUS, AND DEVICE MANUFACTURING METHOD

FIELD OF THE INVENTION

The present invention relates to a technique, which is preferably used for aligning and controlling to move an object in an exposure apparatus, various precision machineries, various precision measuring apparatuses, or the like, used in the semiconductor manufacturing lithography step.

BACKGROUND OF THE INVENTION

Conventionally, as an exposure apparatus used for manufacturing a semiconductor device, there have been known an apparatus called a stepper and an apparatus called a scanner. The stepper reduces a pattern image formed on a reticle and projects the pattern image onto a wafer via a projection lens while moving step by step the semiconductor wafer on a wafer stage below the projection lens, thus sequentially exposing a plurality of portions on one wafer.

The scanner relatively moves a semiconductor wafer on the wafer stage and the reticle on a reticle stage with respect to the projection lens, irradiates the wafer with slit-shaped exposure light during scanning movement, and projects the reticle pattern onto the wafer.

The stepper and scanner are considered to be the mainstream of exposure apparatuses in terms of the resolution and overlay accuracy.

Such an exposure apparatus has a wafer stage which moves a wafer at high speed and aligns it. When the stage is driven, the acceleration/deceleration of the stage generates the reaction force of an inertial force. Transmission of this reaction force to a stage base causes swings and vibrations of the stage base. Additionally, such swings and vibrations induce natural vibrations in the mechanism of the exposure apparatus, and high-frequency vibrations occur. This may interfere with high-speed, high-precision alignment.

In order to avoid this direct transmission of the reaction force to the stage base, the following structures are considered to be the mainstream: the stator of a linear motor which drives the stage is supported on a floor independently of the stage base, the stator can be so moved as to cancel the reaction force generated during stage movement, or the vibrations of the device with the movable stator are reduced by applying a compensation force, which is equivalent to the reaction force of the stage base.

These days, the acceleration in driving the stage is increasing along with an increase of processing speed (throughput). For example, in a step & scan exposure apparatus, the maximum acceleration of a wafer stage reaches 1 G.

In addition, the mass of a stage increases along with an increase in diameter of the substrate wafer. For this reason, a driving force defined by <mass of moving member (substrate wafer and stage)>×<acceleration> becomes very large, and its reaction force becomes enormous. Hence, the reaction force increases along with the increase in acceleration and mass of the moving member, and vibrations of an installation floor due to the reaction force have become non-negligible.

In order to directly solve the above problems of the reaction force, some proposals have been made.

For example, a device described in Japanese Patent Laid-Open No. 2000-206279 includes a mass body driving mechanism which reduces the reaction force generated during the stage movement. The control system of this mass body driving mechanism includes a reaction force compensation control system and position compensation control system.

Furthermore, Japanese Patent Laid-Open No. 2002-008971 describes a device that includes a stage device, which is driven by an electromagnetic actuator (linear motor) including a moving element and stator, a recoilless stage, which absorbs the reaction force by using the stator as a reaction force counter, which receives the reaction force of the moving element. The control system of this arrangement need not include the reaction force compensation control system, and only includes the position compensation control system.

In these two conventional devices described above, the reaction force generated in the horizontal direction (on an X-Y plane in the direction of the stage movement) and an offset load (inclined for the X-Y plane) about a horizontal axis can be perfectly canceled. However, the driving stroke of a mass body is a problem to cancel the rotational reaction force about the vertical axis (about a normal line of the X-Y plane).

For example, when the stage is accelerated at the position shifted from the barycenter of the stage base, in order to cancel moments generated by the stage base, mass bodies symmetrically positioned on opposing sides about the barycenter of the stage base are acceleratedly driven in the same direction as the moving direction of the barycenter of the stage.

When the stage continues to rotate around the barycenter of the stage base, the position of the mass body is shifted. Hence, a stroke for driving the mass body is required. Additionally, even if the stroke of the mass body is made long, the position of the mass body accordingly reaches the terminal end of the stroke when the moments generated by the stage base act in a single direction.

When the stage obliquely moves, the electromagnetic actuator operates while a thrust is so distributed as to avoid generating a rotational moment on each beam (guide bar). Since the thrust of the mass body in acceleration is different from that in deceleration, the mass body does not stop, and continues to move at a constant speed.

In order to avoid this situation, the position compensation control system of the mass body, in which a rotational operation amount in driving the mass body is limited, and a filter processing function is added, is proposed for the purpose of reducing the reaction force, and the like, generated during the stage movement, and reducing the driving stroke of the mass body.

Usually, in a general exposure apparatus, the moving element of the electromagnetic actuator is used as a permanent magnet, and a coil is provided in the stator in order to avoid heat conduction to the stage. Therefore, the stator serving as the reaction force counter needs to move together with a wiring of coils and cooling pipes, i.e., implementation. The implementation resistance becomes a disturbance in the stator position compensation control system serving as the reaction force counter. In the above arrangement, in which the rotational operation amount of the mass body is limited, and the filter function is added, when the implementation resistance is larger than the parameter of the operation amount, or varies at the component higher than the filter cut-off frequency, the position of the reaction force counter may shift by the disturbance.

When this position of the reaction force counter shifts, the offset load about the horizontal axis generated on the stage base by the gravity cannot be canceled, and the offset load is generated on the floor. This causes the deformation of the structure, thereby degrading the accuracy.

SUMMARY OF THE INVENTION

The present invention has been made in consideration of the above problems, and has as its object to reduce a reaction force about a vertical axis while canceling an offset load generated during a stage movement in a translational direction and about a horizontal axis in order to avoid an effect of an implementation resistance of a mass body.

Modes of the present invention to solve the above problems and achieve the object will be enumerated below.

[Mode 1]

A stage device comprises a base plate, which includes a reference surface, a stage which can move along the reference surface, a mass body which can move with respect to the base plate or a structure of the base plate in a predetermined movable range, and a control unit which drives and controls the mass body so as to cancel a reaction force in a translational direction generated during a movement of the stage and an offset load about a horizontal axis, and to reduce a rotational reaction force about a vertical axis.

[Mode 2]

In mode 1, the control unit drives and controls the mass body so as to correct a positional shift generated when the mass body does not reciprocate on a single locus.

[Mode 3]

In mode 1, the control unit drives and controls the mass body so as to reduce a speed of the mass body after the stage obliquely moves.

[Mode 4]

In mode 1, the control unit drives and controls the mass body so as to correct a positional shift generated after the stage obliquely moves or when the mass body does not reciprocate on a single locus to a desired position by limiting the reaction force from the stage.

[Mode 5]

In mode 1, the control unit drives and controls the mass body so as to correct a positional shift generated after the stage obliquely moves or when the mass body does not reciprocate on a single locus to a desired position at the timing other than the timing of requesting the stage accuracy.

[Mode 6]

In mode 1, the control unit drives and controls the mass body on the basis of scheduled operational route information of the stage.

[Mode 7]

In mode 1, the control unit includes a mass body model control unit which generates a virtual control target value of the mass body to cancel the rotational reaction force about the horizontal axis generated during the movement of the stage, on the basis of target position information of the stage, and a mass body model based on the virtual control target value, and the control unit drives and controls the mass body by using vertical position information of the mass body model as an actual mass body control target value.

[Mode 8]

In mode 7, the control unit further comprises a limit processing unit which limits the virtual control target value of the mass body model.

[Mode 9]

In mode 7, the control unit further comprises a filter processing unit which filters the virtual control target value of the mass body model.

[Mode 10]

In mode 1, the mass body comprises a stator of a linear motor which drives the stage, and the mass body is driven and controlled on the basis of a reaction force in driving a moving element of the linear motor and a driving force generated by the mass body driving unit.

[Mode 11]

A control method of a stage device, which comprises a base plate which includes a reference surface, a stage which can move along the reference surface, a mass body which can move with respect to the base plate or a structure of the base plate in a predetermined movable range, and a control unit which drives and controls the mass body, comprises canceling an offset load in a translational direction and about a horizontal axis generated during a movement of the stage, and driving and controlling the mass body to reduce a rotational reaction force about a vertical axis.

[Mode 12]

An exposure apparatus which relatively scans an original and a substrate, and exposes a pattern on the original to the substrate by using a stage device in any one of the modes 1 to 10.

[Mode 13]

A device manufacturing method of manufacturing a semiconductor device by using an exposure apparatus in mode 11.

As described above, in the present invention, the reaction force about the vertical axis can be reduced while canceling the offset load in a translational direction and about a horizontal axis generated during the stage movement in order to avoid receiving the effect of the mounting resistance of the mass body.

Other objects and advantages besides those discussed above shall be apparent to those skilled in the art from the description taken of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENTS

As an example, the features and advantages according to the embodiments of the present invention will be described in detail below with reference to the accompanying drawings.

[Stage Device]

Figure 1A:
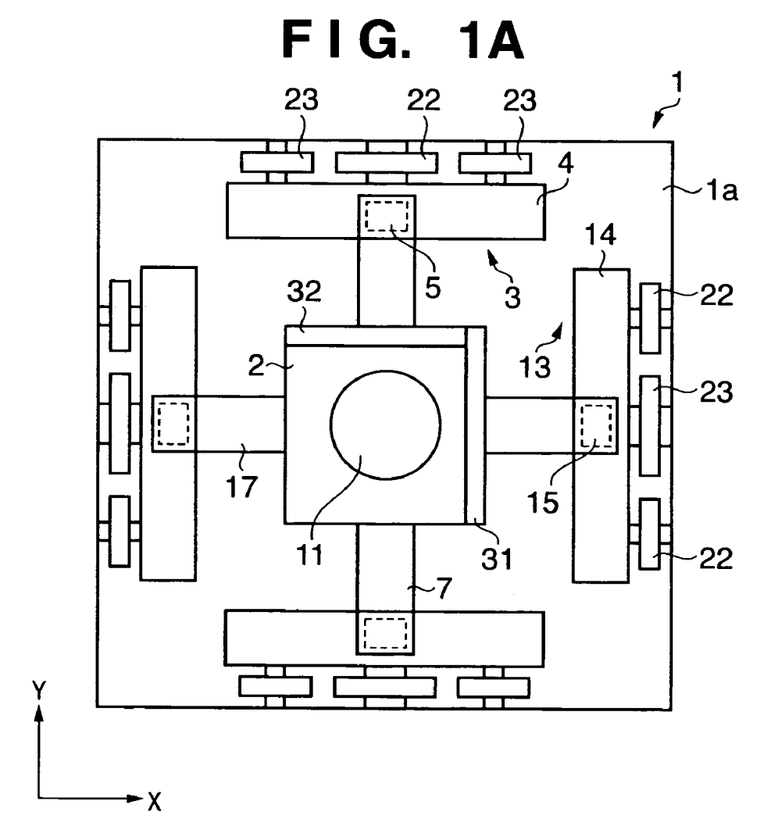
FIGS. 1A and 1B are schematic diagrams of a stage device according to an embodiment of the present invention.
Figure 1B:
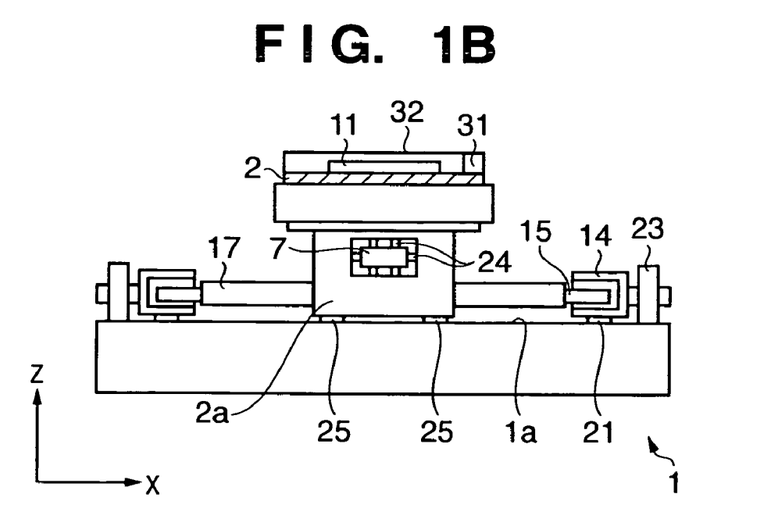

FIGS. 1A and 1B are schematic diagrams of a stage device according to an embodiment of the present invention.

The stage device shown in FIGS. 1A and 1B includes a stage base 1 having a reference surface 1a, a stage 2 on which a wafer chuck 11 for suctioning and holding a semiconductor wafer is mounted, and a stage X-direction linear motor 3 and stage Y-direction linear motor 13 each of which serves as a stage driving mechanism for moving a slider 2a on which the stage 2 is fixed on the reference surface 1a of the stage base 1.

The stage X-direction linear motors 3 are provided to move the slider 2a (stage 2) in the X direction in FIGS. 1A and 1B. Each of the stage X-direction linear motors 3 includes a motor stator (coil) 4, which is movable provided with respect to the reference surface 1a of the stage base 1, and motor moving element (permanent magnet) 5, which is movable with respect to the motor stator 4. These stage X-direction linear motors 3 oppose each other on the reference surface 1a of the stage base 1.

The motor stator 4 serving as a mass body is axially and movably supported by a hydrostatic bearing (air bearing) 21 with respect to the reference surface 1a of the stage base 1. The motor stator 4 can move in the X direction with respect to the reference surface 1a of the stage base 1 by a stator X-direction linear motor 22, and also in the Y direction with respect to the reference surface 1a of the stage base 1 by a stator Y-direction linear motor 23.

Then, the motor moving elements 5 opposing each other are connected by a guide bar 7, and the slider 2a is axially supported by a hydrostatic bearing 24 with respect to the guide bar 7. As a result, the slider 2a (stage 2) moves in the X direction upon movement of the guide bar 7 in the X direction, and the slider 2a (stage 2) also moves in the longitudinal direction (Y direction) of the guide bar 7 upon movement of a guide bar 17 in the Y direction.

The stage Y-direction linear motors 13 are provided to move the slider 2a (stage 2) in the Y direction perpendicular to the X direction in FIGS. 1A and 1B. Each of the stage Y-direction linear motors 13 includes a motor stator (coil) 14, which is movably provided with respect to the reference surface 1a of the stage base 1, and motor moving element (permanent magnet) 15, which is movable with respect to the motor stator 14 as in the stage X-direction linear motor 3. These stage Y-direction linear motors 13 oppose each other on the reference surface 1a of the stage base 1.

The motor stator 14 serving as a mass body is axially and movably supported by a hydrostatic bearing (air bearing) 21 with respect to the reference surface 1a of the stage base 1. The motor stator 14 can move in the X direction with respect to the reference surface 1a of the stage base 1 by a stator X-direction linear motor 22, and also in the Y direction with respect to the reference surface 1a of the stage base 1 by a stator Y-direction linear motor 23.

Then, the motor moving elements 15 opposing each other are connected by a guide bar 17, and the slider 2a is axially supported by a hydrostatic bearing 24 with respect to the guide bar 17. As a result, the slider 2a (stage 2) moves in the Y direction upon movement of the guide bar 17 in the Y direction, and the slider 2a (stage 2) also moves in the longitudinal direction (Y direction) of the guide bar 17 upon movement of a guide bar 17 in the X direction.

Note that the bottom portion of the slider 2a is also axially supported by a hydrostatic bearing 25 with respect to the reference surface 1a of the stage base 1.

In addition to the above X-Y direction, the stage 2 can move in the rotational direction about a normal line (vertical axis) of the reference surface 1a. The stage 2 can also tilt with respect to the reference surface 1a (i.e., can rotate about the horizontal axis). The heights of the barycenters of the stators 4 and 14 serving as the mass bodies are preferably the same as those of the stage 2.

The position of the stage 2 is measured by a laser interferometer (not shown) by using reflecting beams obtained by irradiating laser beams on bar mirrors 31 and 32 fixed on the two adjacent sides of the stage 2. In the exposure apparatus used in the lithography step during the manufacture of a stage semiconductor device, the position of the stage 2 is preferably used for relatively aligning a substrate (semiconductor wafer) and an original (reticle) on which a circuit pattern is drawn, or for aligning an object in various precision machineries, various precision measuring apparatuses, or the like.

[Control System]

Figure 2:
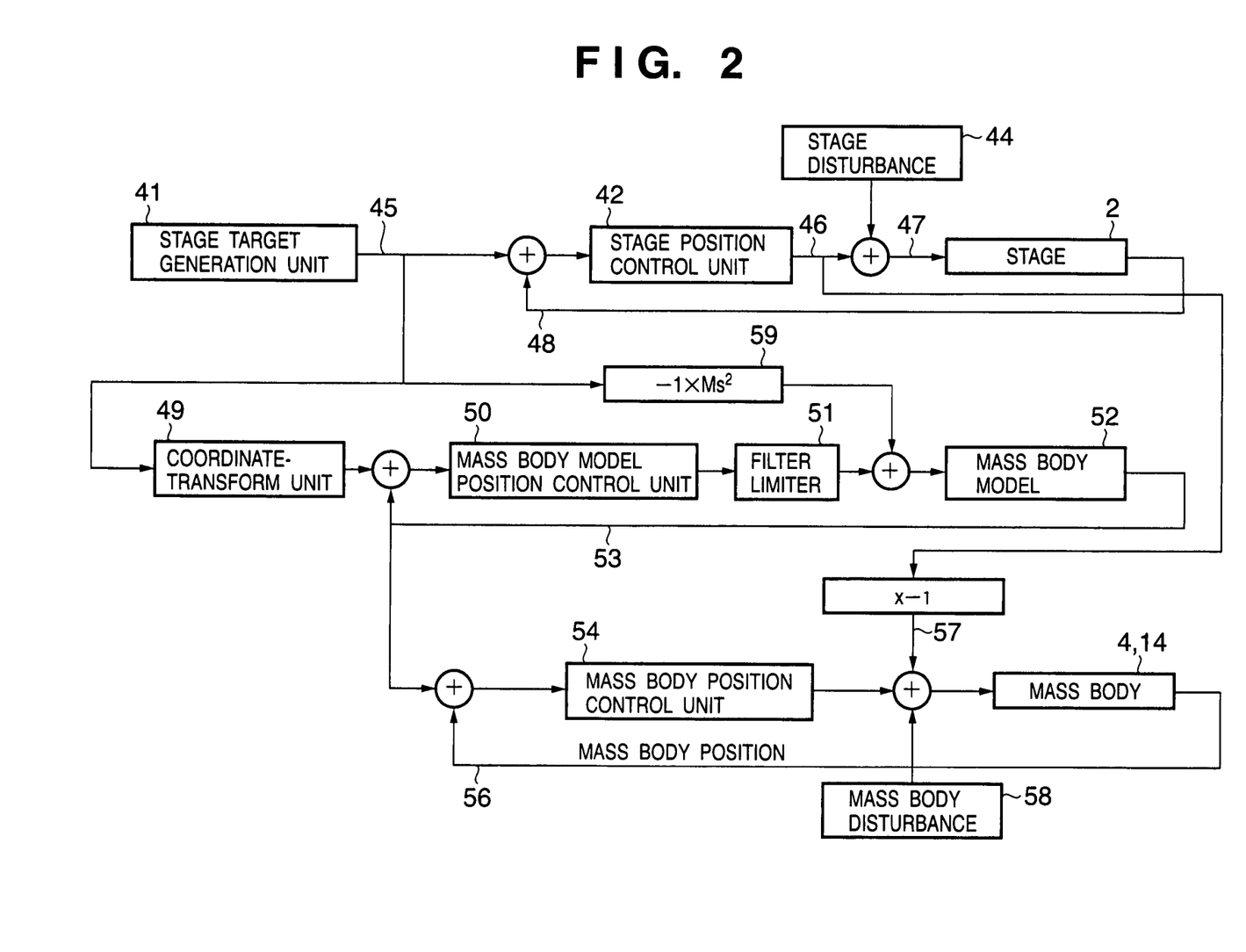
FIG. 2 is a block diagram of a control system of the embodiment which best represents the feature of the present invention.

FIG. 2 is a block diagram of a control system of the embodiment which best represents the feature of the present invention. The same reference numerals denote the same or equivalent parts in FIGS. 1A and 1B.

As shown in FIG. 2, reference numeral 41 denotes a stage target generation unit which sequentially generates a stage target position 45, and 42; a stage position control unit which determines a stage motor driving force 46 to the stage X-direction linear motor and stage Y-direction linear motor for moving the stage 2 on the basis of the deviation of the stage position obtained by subtracting a current stage position 48 from the stage target position 45 in a feedback loop. A driving force 47 to the stage 2 is calculated from the stage motor driving force 46 determined by the stage position control unit 42 and a stage disturbance 44 input to the stage 2.

Reference numeral 49 denotes a coordinate transform unit which coordinate-transforms the stage target position 45 into the target position of a mass body model 52, 50, a mass body model position control unit which determines a virtual driving force of the mass body model 52 on the basis of the deviation of the mass body model position obtained by subtracting a virtual position 53 of the mass body model 52 in the feedback loop from the target position of the coordinate-transformed mass body model 52, and 51, a filter limiter which limits the virtual driving force determined by the mass body model position control unit 50 and removes the high-frequency component. The virtual driving force to the mass body model 52 is calculated from the virtual driving force processed by the filter limiter 51, and a virtual reaction force 59 in an ideal stage of the mass body model 52 obtained by multiplying the second-order differential of the stage target position 45 by a stage mass M.

Furthermore, reference numeral 54 denotes a mass body position control unit which determines the driving force to the mass bodies 4 and 14 on the basis of the deviation of the mass body position obtained by subtracting a current position 56 of the mass bodies 4 and 14 in the feedback loop from the virtual position 53 of the mass body model 52. The driving force to the mass bodies 4 and 14, which receive the reaction force of the driving force 46 of the linear motor is calculated from a reaction force 57 generated by the stage motor driving force 46 and a mass body disturbance 58 generated by the wiring to the mass bodies 4 and 14, the mounting load such as the piping, or the like.

In the above arrangement, the stage target generation unit 41 sequentially generates the stage target position 45 in accordance with the predetermined object. The stage position control unit 42 generates the stage motor driving force 46 so that the difference between the stage current position 48 and the stage target position 45 is zero.

In addition to the stage motor driving force 46, the force generated by the stage disturbance 44 is also added to the stage 2. However, the effect of the force is suppressed to a fraction of a loop gain since the feedback loop is formed.

On the other hand, the stage motor driving force 46 is used as the reaction force 57 with respect to the mass bodies 4 and 14, and the mass bodies 4 and 14 are driven in the direction opposite to the stage 2 by the stator motors 22 and 23.

The mass body model 52 is driven by using the target position of the mass body model 52 calculated by coordinate-transforming the stage target position 45 in the coordinate transform unit 49, as the target value to the feedback loop. The target position of this coordinate-transformed mass body model 52 is calculated as the value which cancels the reaction force in the translational direction (X-Y direction) and the rotational reaction force about the horizontal axis (in the tilt direction) generated during the stage movement. At this time, the virtual driving force to the mass body model 52 is calculated by the ideal reaction force 59 obtained from the stage target position 45, and the vertical driving force in which the amplitude and band of the virtual driving force determined by the mass body model position control unit 50 are limited by the filter limiter 51.

Then, the virtual position 53 of the above mass body model 52 is used as the target value to the feedback loop of the actual mass bodies 4 and 14. Even when the force of the mass body disturbance 58 acts on the mass bodies 4 and 14, the effect is suppressed to a fraction of the loop gain.

In the control system arranged as in the above embodiment, the target position of the mass body is generated by using the stage target position in FIG. 2. Hence, for example, the mass body is so driven and controlled as to correct the positional shift generated when the mass body does not reciprocate on a single locus.

As a result of the operation in the control system in FIG. 2, the mass body is so driven and controlled as to reduce the speed of the mass body after the stage obliquely moves.

Since the filter limiter 51 is included, the mass body is so driven and controlled as to correct the positional shift generated after the stage obliquely moves or when the mass body does not reciprocate on a single locus, to the desired position by limiting the reaction force from the stage.

[Modification]

In the above embodiment, the target value of the mass bodies 4 and 14 is calculated by coordinate-transforming the stage target position 45 into the target position which cancels the reaction force in the translational direction and the rotational reaction force about the horizontal axis generated during the stage movement. The virtual driving force determined by this target position and the feedback loop of the virtual position 53 of the mass body model 52 serving as the internal model is limited by a filter and limiter, and the obtained virtual position of the mass body model 52 is accordingly applied as the actual target value of the mass bodies 4 and 14. When the stage movement route is clear, in advance, as shown in the control block in FIG. 3, a mass body movement distance calculation unit 61 may calculate, in advance, on the basis of a scheduled stage route information 60, the movement distance of the mass body, which is generated only by the reaction force of the stage when the stage 2 moves on the predetermined route. A mass body compensation target generation unit 62 may generate the value, which cancels the movement distance in the movement time of the predetermined route, as the target value of the mass body. In this case, the mass body can be controlled by the movement amount less than that in the above embodiment. Hence, the actuator required for the mass body position compensation control can be small, and the generated heat can be reduced.

Figure 3:
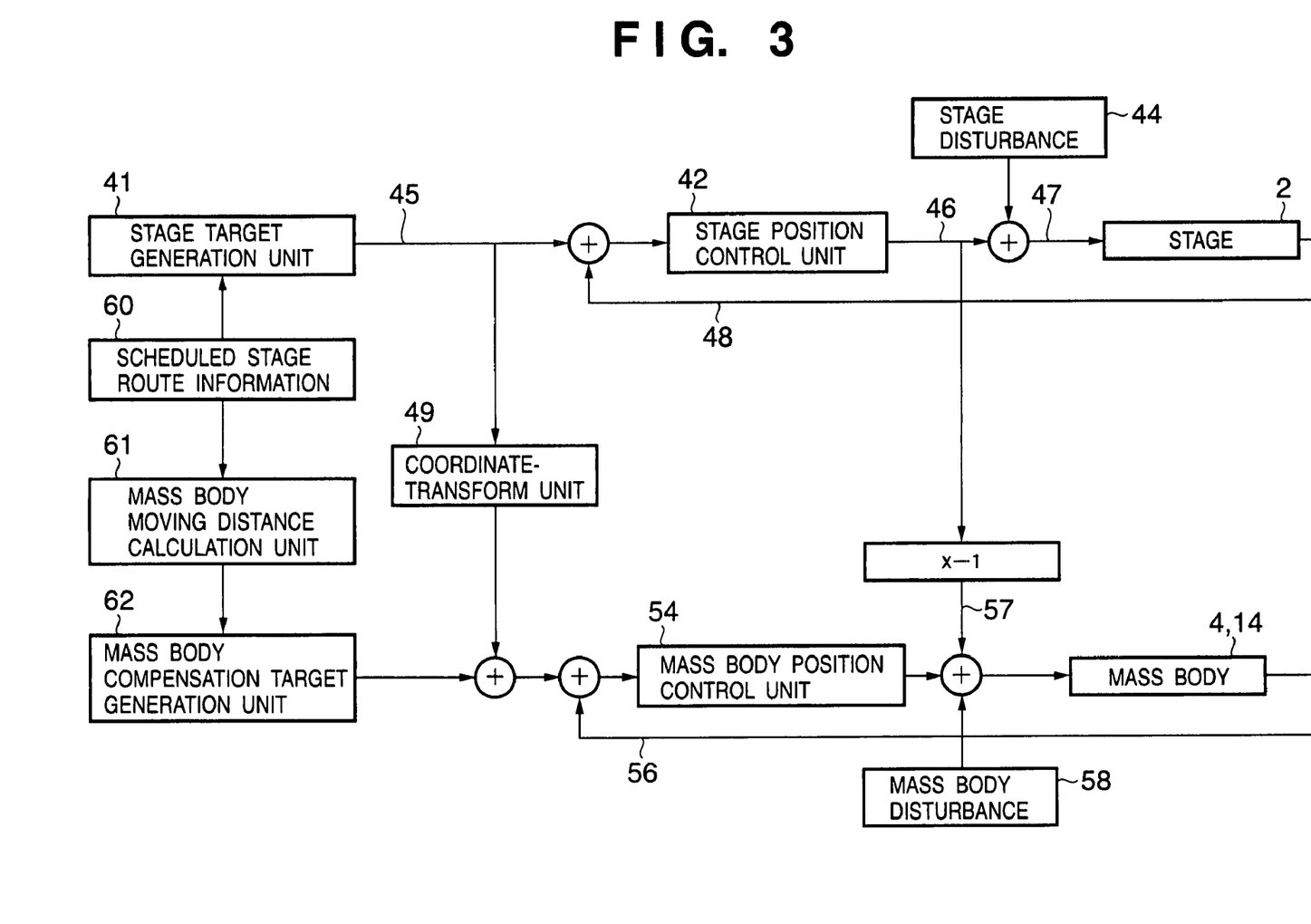
FIG. 3 is a block diagram of a modification according to the embodiment of the present invention.

In the control system arranged as in the modification, the mass body is so driven and controlled as to correct the positional shift generated after the stage obliquely moves and when the mass body does not reciprocate on the single locus to the desired position at the timing other than the timing of requesting the stage accuracy.

Furthermore, in this embodiment, the mass body also serves as the stator of the linear motor. However, the mass body may be an independent mass body including the reacting force compensation control system. In this embodiment, the mass body is independent of the stage base. However, the same effect can be obtained when the stage base is used as the mass body, and compensates for the position with respect to the arrangement.

Figure 4:
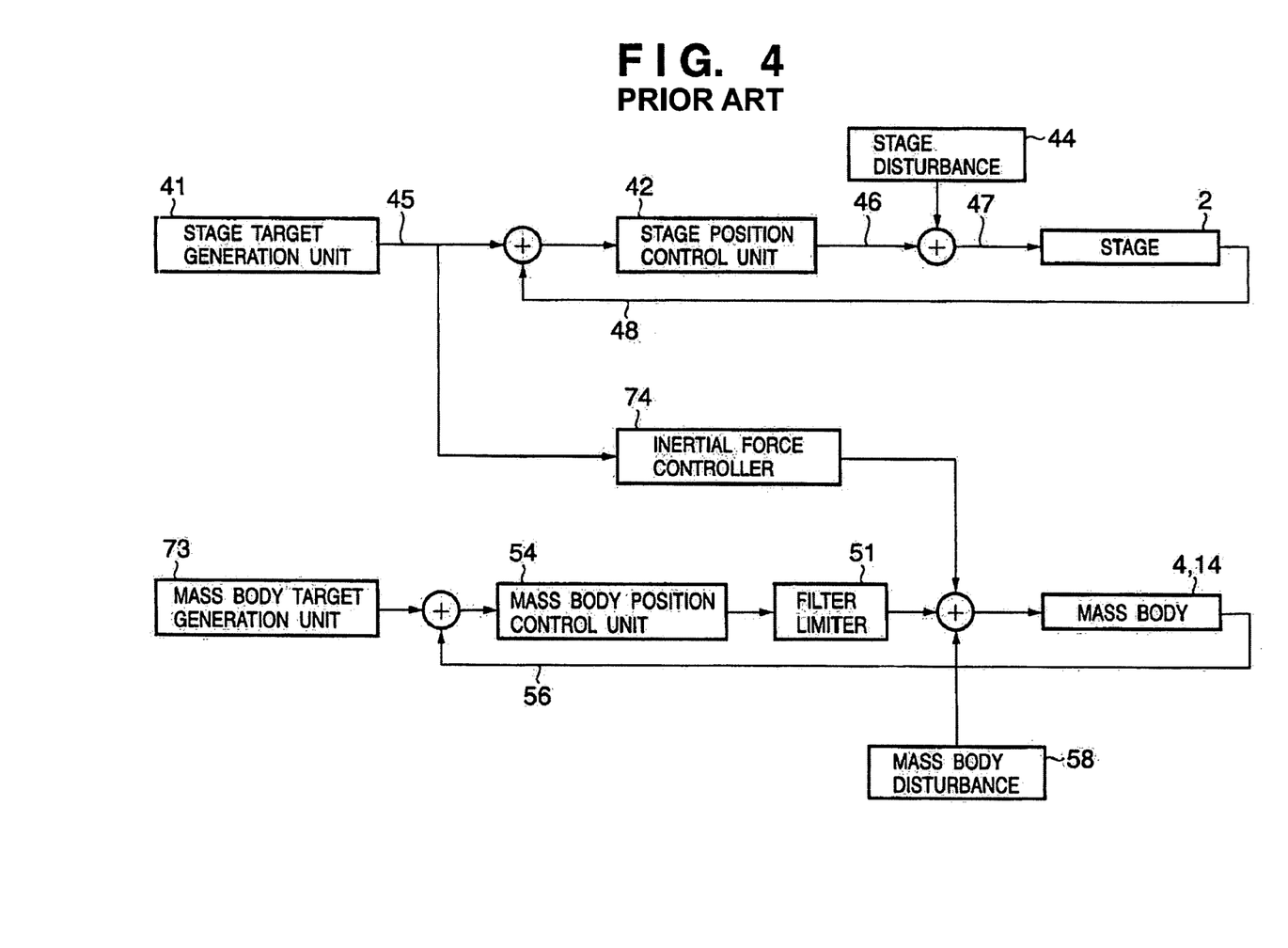
FIG. 4 is a block diagram of a conventional control system.

FIG. 4 is a block diagram of a conventional control system. In the conventional control system, a mass body target generation unit 73 determines the target value of the mass bodies 4 and 14 independently of the stage target position 45. The driving force to the mass bodies 4 and 14 is calculated from the value in which the amplitude and band of the driving force determined by the mass body position control unit 54 are limited by the filter limiter 51, the inertial force obtained from the stage target position 45 by an inertial force controller 74, and the mass body disturbance 58 generated from the wiring and piping, i.e., implementation loads to the mass bodies 4 and 14, or the like.

On the contrary, in the control system of this embodiment, the target value of the mass bodies 4 and 14 is calculated by coordinate-transforming the stage target position 45 into the target position which cancels the reaction force in the translational direction and the rotational reaction force about the horizontal axis, which are generated during the stage movement. The virtual driving force determined by this target position and the feedback loop of the virtual position 53 of the mass body model 52 serving as the internal model is limited by the filter and limiter, and the obtained virtual position of the mass body model 52 is accordingly applied as the actual target value of the mass bodies 4 and 14.

Therefore, compared with the prior art, the reaction force about the vertical axis can be reduced while canceling the offset load in a translational direction and about a horizontal axis generated during the stage movement in order to avoid the effect of the implementation resistance of the mass body.

[Exposure Apparatus]

Figure 5A:
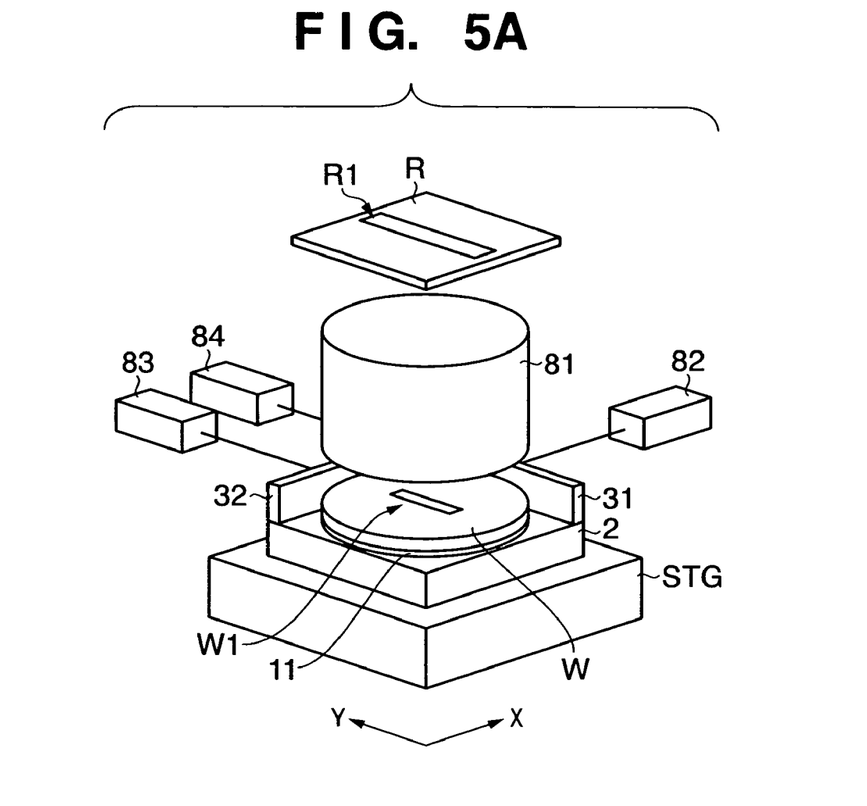
FIGS. 5A and 5B show schematic diagrams of an exposure apparatus according to the embodiment of the present invention.

As shown in FIG. 5A, the exposure apparatus, which includes the above stage device STG has a reticle R on which the circuit pattern is drawn, and an illumination optical system 80, which illuminates a slit-shaped irradiation area R1 on the reticle R with illumination light. A part of the drawing pattern of the irradiated reticle R is transferred to a wafer W via a projection lens 81 serving as a projection optical system.

The exposure apparatus includes the wafer stage 2, which holds the wafer W and can move on the X-Y plane perpendicular to the projection lens 81, laser interferometers 82, 83, and 84 for measuring the position and posture of the wafer stage 2, and reflection mirrors 31 and 32 fixed on the wafer stage 2. The slit-shaped shot W1 is transferred on the wafer W.

Note that the stage is not limited to the wafer stage as far as the reticle R and wafer W are relatively scanned. The reticle stage, which holds the reticle R and can move on the X-Y plane perpendicular to an optical axis of the projection lens 81, may be added.

Figure 5B:
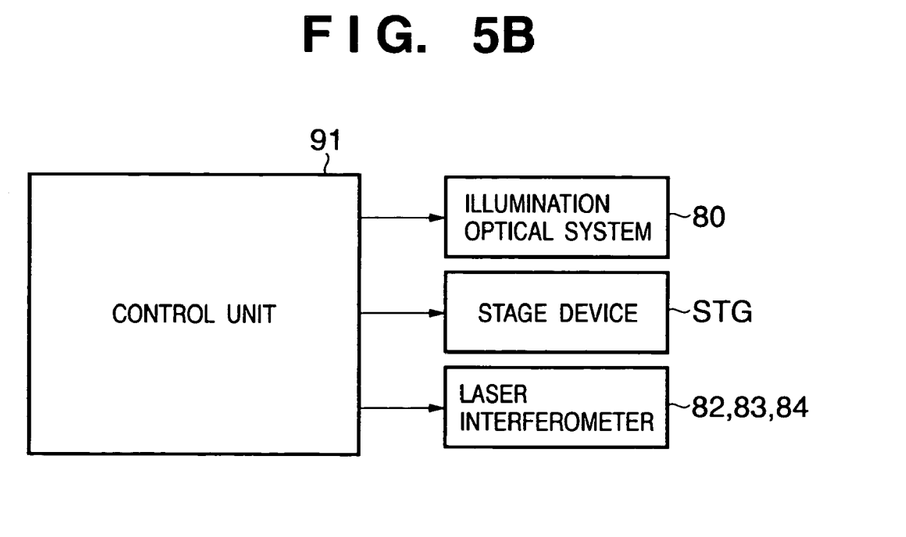

Furthermore, as shown in FIG. 5B, a control unit 91, which performs an operation related to the stage movement and exposure, such as irradiation of the illuminating light, is provided. This control unit 91 includes the control system shown in FIG. 2 or 3.

[Device Manufacturing Method]

The embodiment of a device manufacturing method implemented by using the above-described exposure apparatus will now be described.

Figure 6:
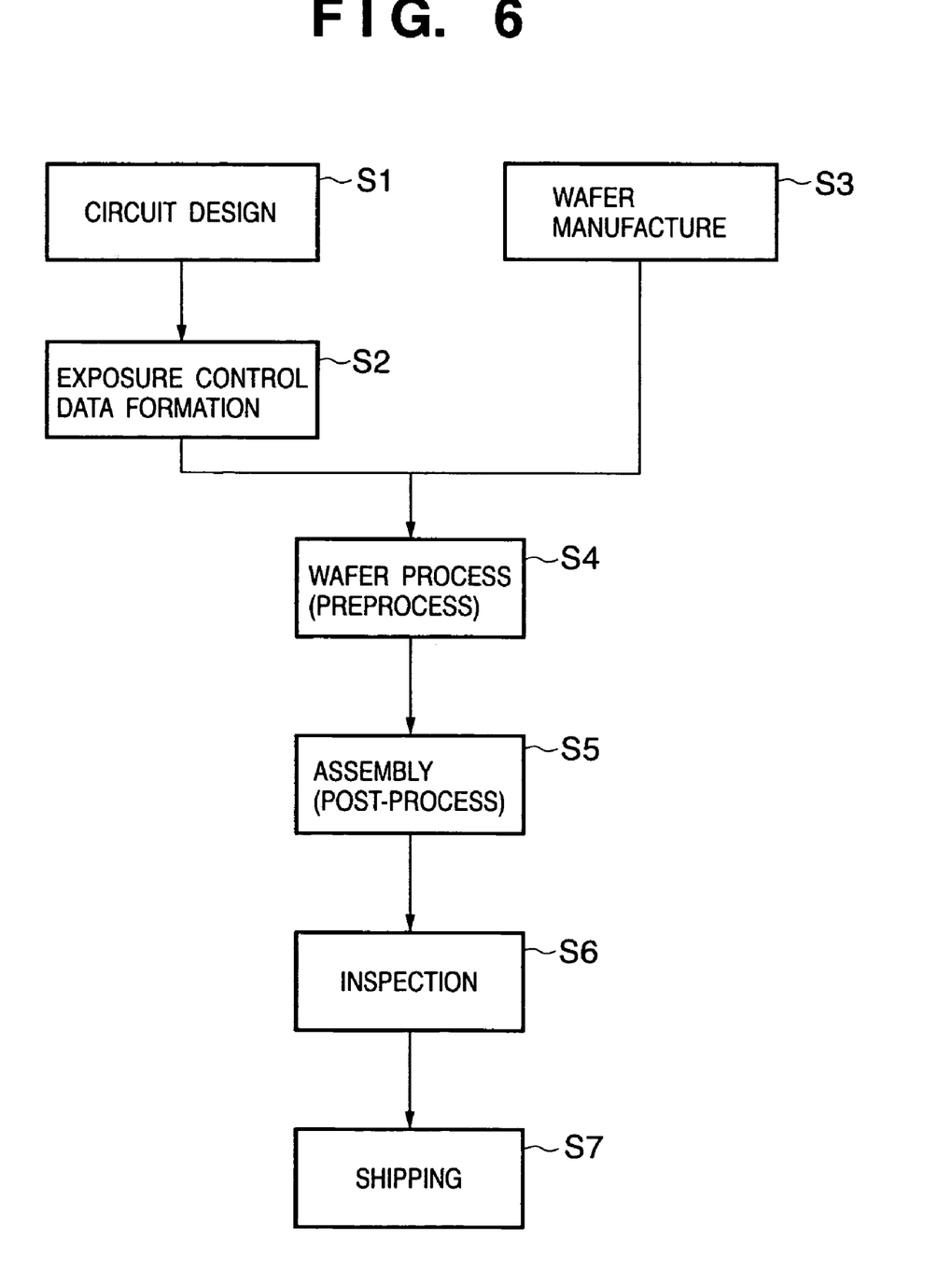
FIG. 6 is a flow chart showing the flow of the manufacturing process of a microdevice.

FIG. 6 shows the flow of manufacturing the microdevice (e.g., a semiconductor chip, such as an IC and LSI, liquid crystal panel, CCD, thin film magnetic head, micro machine, and the like). In step S1 (circuit design), a semiconductor device circuit is designed. In step S2 (exposure control data creation), exposure control data of the exposure apparatus is created on the basis of the designed circuit pattern. In step S3 (wafer manufacture), a wafer is manufactured by using a material such as silicon. In step S4 (wafer process), called a preproces, an actual circuit is formed on the wafer by lithography using the exposure apparatus in which the prepared exposure control data is input and the wafer. Step S5 (assembly), called a post-process, is the step of forming a semiconductor chip by using the wafer formed in step S4, and includes an assembly process (dicing and bonding) and a packaging process (chip encapsulation). In step S6 (inspection), the semiconductor device manufactured in step S5 undergoes inspections such as an operation confirmation test and a durability test. After these steps, the semiconductor device is completed and shipped (step S7).

Figure 7:
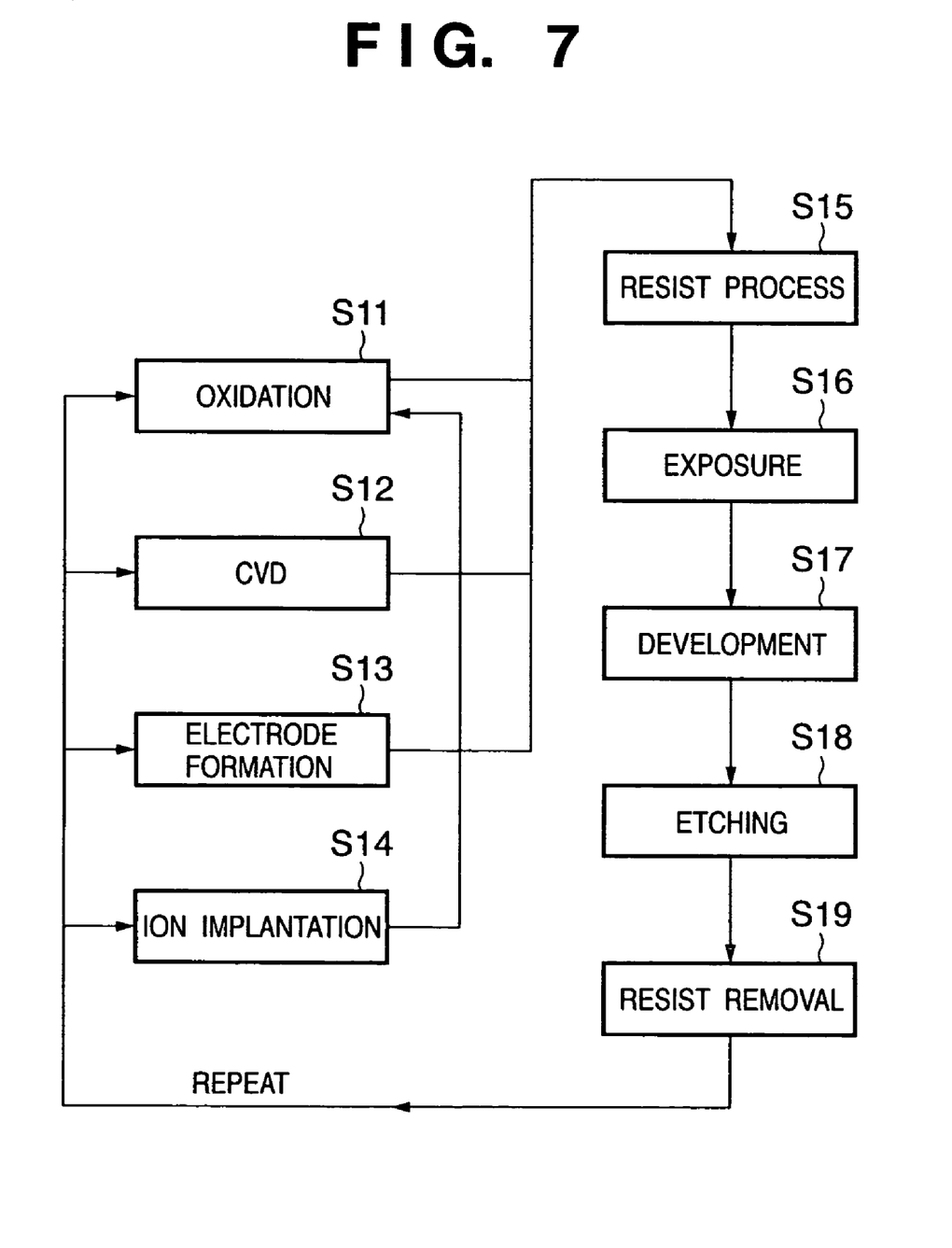
FIG. 7 is a flow chart showing the wafer process.

FIG. 7 shows the detailed flow of the above-mentioned wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist processing), a photosensitive agent is applied to the wafer. In step S16 (exposure), the circuit pattern is transferred onto the wafer. In step S17 (development), the exposed wafer is developed. In step S18 (etching), the resist is etched except for the developed resist image. In step S19 (resist removal), an unnecessary resist after etching is removed. These steps are repeated to form multiple circuit patterns on the wafer.

By using the manufacturing method of this embodiment, a high-density semiconductor device, which has been difficult to be manufactured, can be manufactured at low cost.

OTHER EMBODIMENT

The embodiment has been described in detail. However, the present invention may be applied to a system constituted by a plurality of devices, or a system constituted by one device.

In the present invention, a software program (position compensation control in the present invention) for realizing the functions of the above-described embodiment may be supplied to a system or device directly or from a remote place, and the computer of the system or device may read out and execute the supplied program code. In this case, the program need not be a program as far as the program has a program function.

Therefore, the present invention includes a program code itself, which is installed in a computer, in order to realize the present invention. That is, the claims of the present invention include the computer program itself for realizing the function or processing of the present invention.

In this case, as far as the program has the program function, the program may include an object code, a program executed by an interpreter, script data supplied to an OS, and the like. The type of program is not particularly limited.

The recording medium for supplying the program includes, e.g., a flexible disk, a hard disk, an optical disk, a magnetooptical disk, an MO, a CD-ROM, a CD-R, a CD-RW, a magnetic tape, a nonvolatile memory card, a ROM, and a DVD (DVD-ROM or DVD-R).

The program can also be supplied by connecting a client computer to an Internet homepage by using the browser of the client computer, or downloading the computer program itself or a compressed file containing an automatic installing function of the present invention from the homepage to a recording medium, such as a hard disk. The program can also be realized by dividing the program code included in the program of the present invention into a plurality of files and downloading the files from different homepages. That is, the claims of the present invention also includes a worldwide web (WWW) server, which allows the user to download the program file for realizing the function or processing of the present invention by the computer.

The program can also be realized by distributing to the user a storage medium such as a CD-ROM which stores the encrypted program of the present invention, causing a user who satisfies predetermined conditions to download decryption key information from a homepage via the Internet, and installing in a computer the encrypted program by using the key information.

The program can also be realized by distributing to the user a storage medium, such as a CD-ROM, which stores the encrypted program of the present invention, causing a user who satisfies predetermined conditions to download decryption key information from a homepage via the Internet, and installing in a computer the encrypted program by using the key information.

The functions of the above-described embodiments are realized by executing the readout program by a computer. The embodiments of the present invention also include a case in which an operatinG system (OS), or the like, running on the computer performs part of or all of actual processing on the basis of the instructions of the program, and this processing realizes the functions of the above-described embodiment.

Further, the embodiments of the present invention include a case in which, after the program read out from the recording medium is written in the memory of a function expansion board inserted into the computer or the memory of a function expansion unit connected to the computer, the CPU of the function expansion board or function expansion unit performs part of or all of actual processing on the basis of the instructions of the program and this processing realizes the functions of the above-described embodiments.

As many apparently widely different embodiments of the present invention can be made without departing from the spirit and scope thereof, it is to be understood that the invention is not limited to the specific embodiments thereof except as defined in the appended claims.

What is claimed is:

1. A stage device comprising:
   a base plate which includes a reference surface;
   a stage which can move along the reference surface;
   a mass body which can move with respect to said base plate or a structure of said base plate; and
   a control unit which drives and controls said mass body so as to cancel a reaction force in a translational direction generated during a movement of said stage and an offset load about a horizontal axis, and to reduce a rotational reaction force about a vertical axis,
   wherein said control unit includes a mass body model control unit which generates a virtual control target value of said mass body to cancel the rotational reaction force about the horizontal axis generated during the movement of said stage, on the basis of target position information of said stage, and a mass body model based on the virtual control target value, and said control unit drives and controls said mass body by using virtual positional information of the mass body model as an actual mass body control target value.

2. The device according to claim 1, wherein said control unit drives and controls said mass body so as to correct a positional shift generated when said mass body does not reciprocate on a single locus.

3. The device according to claim 1, wherein said control unit drives and controls said mass body so as to reduce a speed of said mass body after said stage obliquely moves.

4. The device according to claim 1, wherein said control unit drives and controls said mass body so as to correct a positional shift generated after said stage obliquely moves or when said mass body does not reciprocate on a single locus to a desired position by limiting the reaction force from said stage.

5. The device according to claim 1, wherein said control unit drives and controls said mass body so as to correct a positional shift generated after said stage obliquely moves or when said mass body does not reciprocate on a single locus to a desired position at the timing other than the timing of requesting the stage accuracy.

6. The device according to claim 1, wherein said control unit drives and controls said mass body on the basis of scheduled operational route information of said stage.

7. The device according to claim 1, wherein said control unit further comprises a limit processing unit, which limits the virtual control target value of the mass body model.

8. The device according to claim 1, wherein said control unit further comprises a filter processing unit, which filters the virtual control target value of the mass body model.

9. The device according to claim 1, wherein said mass body comprises a stator of a linear motor which drives said stage, and said mass body is driven and controlled on the basis of a reaction force in driving a moving element of the linear motor and a driving force generated by the mass body driving unit.

10. An exposure apparatus which relatively scans an original and a substrate, and exposes a pattern on the original to the substrate by using a stage device of claim 1.

11. A device manufacturing method for manufacturing a semiconductor device, said method comprising:
   exposing a pattern on an original to a substrate using an exposure apparatus according to claim 10.

12. A control method of a stage device which comprises a base plate which includes a reference surface, a stage which can move along the reference surface, a mass body which can move with respect to said base plate or a structure of said base plate in a predetermined movable range, and a control unit which drives and controls said mass body, said method comprising:
   generating a virtual control target of the mass body so as to reduce a rotational reaction force about a vertical axis generated during a movement of the stage; and
   driving the mass body by using virtual position information of a mass body model based on the virtual control target value as an actual mass body control target value.

* * * * *

UNITED STATES PATENT AND TRADEMARK OFFICE
CERTIFICATE OF CORRECTION

PATENT NO. : 7,081,950 B2  Page 1 of 1
APPLICATION NO. : 10/849156
DATED : July 25, 2006
INVENTOR(S) : Takao Ukaji It is certified that error appears in the above-identified patent and that said Letters Patent is hereby corrected as shown below:

ON THE COVER PAGE:
In item "(56) References Cited," in the second column, the fourth-listed reference "6,285,457 B1  9/2001  Ukaji ……. 356/500" should read -- 6,285,457 B2  9/2001 Ukaji ……. 356/500 --.

COLUMN 6:
Line 32, "and 42;" should read -- and 42, --.

COLUMN 9:
Line 32, "preproces" should read -- preprocess --.
Line 34, "wafer," should read -- wafer is prepared for processing. --.

COLUMN 10:
Line 4, "directly or" should read -- directly to or --.
Line 33, "includes" should read -- include --.
Line 54, "operatinG" should read -- operating --.

Signed and Sealed this

Thirtieth Day of January, 2007

JON W. DUDAS
*Director of the United States Patent and Trademark Office*